United States Patent
Mei et al.

(10) Patent No.: US 7,450,359 B1
(45) Date of Patent: Nov. 11, 2008

(54) SYSTEM AND METHOD FOR PROVIDING A TEMPERATURE COMPENSATED UNDER-VOLTAGE-LOCKOUT CIRCUIT

(75) Inventors: Tawen Mei, Mountain View, CA (US); Thomas Yang, Milpitas, CA (US)

(73) Assignee: National Semiconductor Corporation, Santa Clara, CA (US)

( * ) Notice: Subject to any disclaimer, the term of this patent is extended or adjusted under 35 U.S.C. 154(b) by 273 days.

(21) Appl. No.: 11/071,867

(22) Filed: Mar. 3, 2005

(51) Int. Cl.
*H02H 3/24* (2006.01)

(52) U.S. Cl. ................ 361/92; 361/90; 361/93.8; 361/103; 361/115

(58) Field of Classification Search .......... 361/90, 361/92, 103, 93.8, 115; 327/142, 143, 198, 327/512–513; 323/907
See application file for complete search history.

(56) References Cited

U.S. PATENT DOCUMENTS

| | | | |
|---|---|---|---|
| 5,440,255 A * | 8/1995 | Fournel | 327/81 |
| 5,532,578 A * | 7/1996 | Lee | 323/313 |
| 5,534,804 A * | 7/1996 | Woo | 327/143 |
| 5,587,866 A * | 12/1996 | Yach et al. | 361/90 |
| 5,838,188 A * | 11/1998 | Taguchi | 327/530 |
| 5,994,945 A * | 11/1999 | Wu et al. | 327/378 |
| 6,275,100 B1 * | 8/2001 | Park et al. | 327/543 |
| 6,593,790 B2 * | 7/2003 | Kim | 327/198 |
| 6,600,639 B1 * | 7/2003 | Teo et al. | 361/92 |
| 6,888,384 B2 * | 5/2005 | Wada | 327/143 |
| 7,161,396 B1 * | 1/2007 | Zhou et al. | 327/143 |
| 2006/0012409 A1 * | 1/2006 | Wadhwa et al. | 327/143 |
| 2006/0145739 A1 * | 7/2006 | Kim | 327/143 |
| 2006/0164136 A1 * | 7/2006 | Shin | 327/143 |

OTHER PUBLICATIONS

I. M. Filanovsky et al., "Mutual Compensation of Mobility and Threshold Voltage Temperature Effects with Applications in CMOS Circuits", IEEE Transactions on Circuits and Systems-I: Fundamental Theory and Applications, vol. 48, No. 7, Jul. 2001, pp. 876-884.
Made Gunawan et al., "A Curvature-Corrected Low-Voltage Bandgap Reference", IEEE Journal of Solid-State Circuits, vol. 28, No. 6, Jun. 1993, pp. 667-670.

* cited by examiner

*Primary Examiner*—Michael J Sherry
*Assistant Examiner*—Terrence R Willoughby

(57) ABSTRACT

A system and a method are disclosed for providing a temperature compensated under-voltage-lockout circuit that has a trip point voltage that is not sensitive to temperature variation. The under-voltage-lockout circuit of the invention comprises (1) an inverter circuit that is coupled to a supply voltage and (2) a temperature compensation circuit that is coupled to the supply voltage and to the inverter circuit. The temperature compensation circuit and the inverter circuit temperature compensate a trip point voltage of the inverter circuit by driving an input of the inverter circuit with a voltage that has a same temperature coefficient as the trip point voltage of the inverter circuit.

20 Claims, 5 Drawing Sheets

_US 7,450,359 B1_

SYSTEM AND METHOD FOR PROVIDING A TEMPERATURE COMPENSATED UNDER-VOLTAGE-LOCKOUT CIRCUIT

TECHNICAL FIELD OF THE INVENTION

The present invention is generally directed to the manufacture of under-voltage-lockout circuits in semiconductor circuits and, in particular, to a system and method for providing a temperature compensated under-voltage-lockout circuit.

BACKGROUND OF THE INVENTION

Under-voltage-lockout (UVLO) circuits are widely used in integrated circuits to monitor a supply voltage level. During supply voltage transients when the supply voltage is at a lower than normal level, the UVLO circuit triggers a protection function. Typically the protection function temporarily shuts down the integrated circuit. The temporary inactivation of the integrated circuit ensures that the integrated circuit will receive a proper level of supply voltage when the integrated circuit is restarted.

Under-voltage-lockout (UVLO) circuits are also known as "power-on reset" circuits. One type of prior art UVLO circuit is the well-known delta-VBE/band-gap circuit. The delta-VBE/band-gap circuit requires a relatively large area of silicon in order to be implemented in an integrated circuit. Other types of prior art UVLO circuits may comprise a small number of transistors. The UVLO circuits that comprise a small number of transistors may be very inaccurate and are temperature sensitive.

Therefore, there is a need in the art for a system and method for providing an accurate and efficient under-voltage-lockout (UVLO) circuit that is not temperature sensitive. There is a need in the art for a system and method for providing an accurate temperature compensated under-voltage-lockout (UVLO) circuit that does not have a large number of transistors.

SUMMARY OF THE INVENTION

To address the above-discussed deficiencies of the prior art, it is a primary object of the present invention to provide a system and method for providing an accurate temperature compensated under-voltage-lockout (UVLO) circuit.

In one advantageous embodiment, the temperature compensated under-voltage-lockout (UVLO) circuit comprises (1) an inverter circuit that is coupled to a supply voltage and (2) a temperature compensation circuit that is coupled to the supply voltage and to the inverter circuit. The temperature compensation circuit temperature compensates a trip point voltage of the inverter circuit by driving an input of the inverter circuit with a voltage that has a same temperature coefficient as the trip point voltage of the inverter circuit.

The inverter circuit comprises a PMOS transistor and a first NMOS transistor. The temperature compensation circuit comprises a first resistor, a second resistor, and a second NMOS transistor. The combination of the inverter circuit and the temperature compensation circuit produces an under-voltage-lockout (UVLO) threshold voltage that is insensitive to temperature variations.

It is an object of the present invention to provide an accurate temperature compensated under-voltage-lockout (UVLO) circuit.

It is also an object of the present invention to provide an accurate temperature compensated under-voltage-lockout (UVLO) circuit that monitors a supply voltage and outputs a trigger signal to enable/disable other circuitry.

It is yet another object of the present invention to provide an under-voltage-lockout (UVLO) threshold voltage that is insensitive to temperature variations.

It is also another object of the present invention to provide an accurate temperature compensated under-voltage-lockout (UVLO) circuit that does not have a large number of transistors.

The foregoing has outlined rather broadly the features and technical advantages of the present invention so that those skilled in the art may better understand the detailed description of the invention that follows. Additional features and advantages of the invention will be described hereinafter that form the subject of the claims of the invention. Those skilled in the art should appreciate that they may readily use the conception and the specific embodiment disclosed as a basis for modifying or designing other structures for carrying out the same purposes of the present invention. Those skilled in the art should also realize that such equivalent constructions do not depart from the spirit and scope of the invention in its broadest form.

Before undertaking the Detailed Description of the Invention below, it may be advantageous to set forth definitions of certain words and phrases used throughout this patent document: the terms "include" and "comprise," as well as derivatives thereof, mean inclusion without limitation; the term "or," is inclusive, meaning and/or; the phrases "associated with" and "associated therewith," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, or the like; and the term "controller" means any device, system or part thereof that controls at least one operation, such a device may be implemented in hardware, firmware or software, or some combination of at least two of the same. It should be noted that the functionality associated with any particular controller may be centralized or distributed, whether locally or remotely. Definitions for certain words and phrases are provided throughout this patent document, those of ordinary skill in the art should understand that in many, if not most instances, such definitions apply to prior uses, as well as future uses, of such defined words and phrases.

BRIEF DESCRIPTION OF THE DRAWINGS

For a more complete understanding of the present invention and its advantages, reference is now made to the following description taken in conjunction with the accompanying drawings, in which like reference numerals represent like parts.

DETAILED DESCRIPTION OF THE INVENTION

FIGS. 1 through 9 and the various embodiments used to describe the principles of the present invention in this patent document are by way of illustration only and should not be construed in any way to limit the scope of the invention. Those skilled in the art will understand that the principles of the present invention may be implemented in any type of suitably arranged circuitry for providing an under-voltage-lockout (UVLO) circuit.

Figure 1:
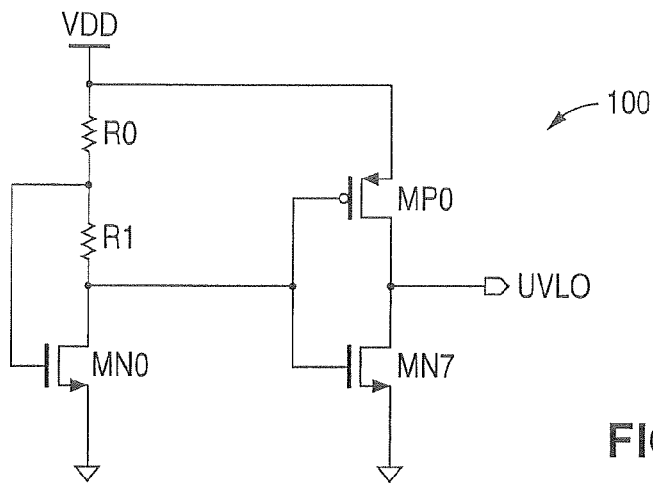
FIG. 1 illustrates a schematic diagram of an under-voltage-lockout (UVLO) circuit constructed in accordance with the principles of the present invention.

FIG. 1 illustrates a schematic diagram of an advantageous embodiment of an under-voltage-lockout (UVLO) circuit 100 of the present invention. UVLO circuit 100 monitors a supply voltage VDD and outputs a trigger signal to enable/disable other circuitry (not shown in FIG. 1). The trigger signal is output to the terminal that is designated UVLO in FIG. 1.

UVLO circuit 100 comprises a PMOS transistor MP0 and an NMOS transistor MN7. The source of PMOS transistor MP0 is coupled to the power supply VDD. The drain of PMOS transistor MP0 is coupled to the drain of NMOS transistor MN7. The gate of PMOS transistor MP0 and the gate of NMOS transistor MN7 are coupled together. The source of NMOS transistor MN7 is coupled to ground.

PMOS transistor MP0 and NMOS transistor MN7 form an inverter circuit. The UVLO terminal is coupled to a point between the drain of PMOS transistor MP0 and the drain of NMOS transistor MN7. The inverter formed by PMOS transistor MP0 and NMOS transistor MN7 provides a UVLO trigger signal to the UVLO terminal.

The power supply VDD is coupled to a first end of resistor R0. The second end of resistor R0 is coupled to a first end of resistor R1. The second end of resistor R1 is coupled to a drain of NMOS transistor MN0. The source of NMOS transistor MN0 is coupled to ground. The gate of NMOS transistor MN0 is coupled to a point that is located between the second end of resistor R0 and the first end of resistor R1. The gates of PMOS transistor MP0 and NMOS transistor MN7 are coupled to a point that is located between the second end of resistor R1 and the drain of NMOS transistor MN0.

In one advantageous embodiment of the invention, the value of the resistance of resistor R0 is thirty thousand ohms (30 kΩ) and the value of the resistance of resistor R1 is seventeen thousand ohms (17 kΩ). The aspect ratio (width to length) of the NMOS transistor MN0 is twenty three to ten (23/10). The aspect ratio (width to length) of the PMOS transistor MP0 is seven to one and a half (7/1.5). The aspect ratio (width to length) of the NMOS transistor MN7 is three and one half to one and one half (3.5/1.5).

Figure 2:
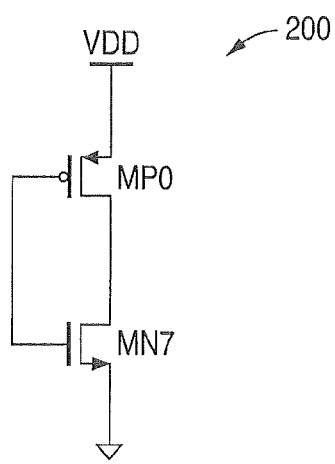
FIG. 2 illustrates a schematic diagram of an inverter circuit comprising a first transistor (MP0) and a second transistor (MN7)

In order to better understand the operation of UVLO circuit 100 consider the operation of only the inverter circuit comprising PMOS transistor MP0 and NMOS transistor MN7. The inverter circuit 200 standing alone is shown in FIG. 2. Assume that the value of the supply voltage VDD is held constant at a predetermined value. For purposes of illustration assume that the value of supply voltage VDD is equal to a desired lockout threshold voltage of two and two tenths volts (2.2 volts). When the inverter 200 is operated with a supply voltage VDD of 2.2 volts the "trip point" of inverter 200 exhibits the temperature behavior shown in FIG. 3.

Figure 3:
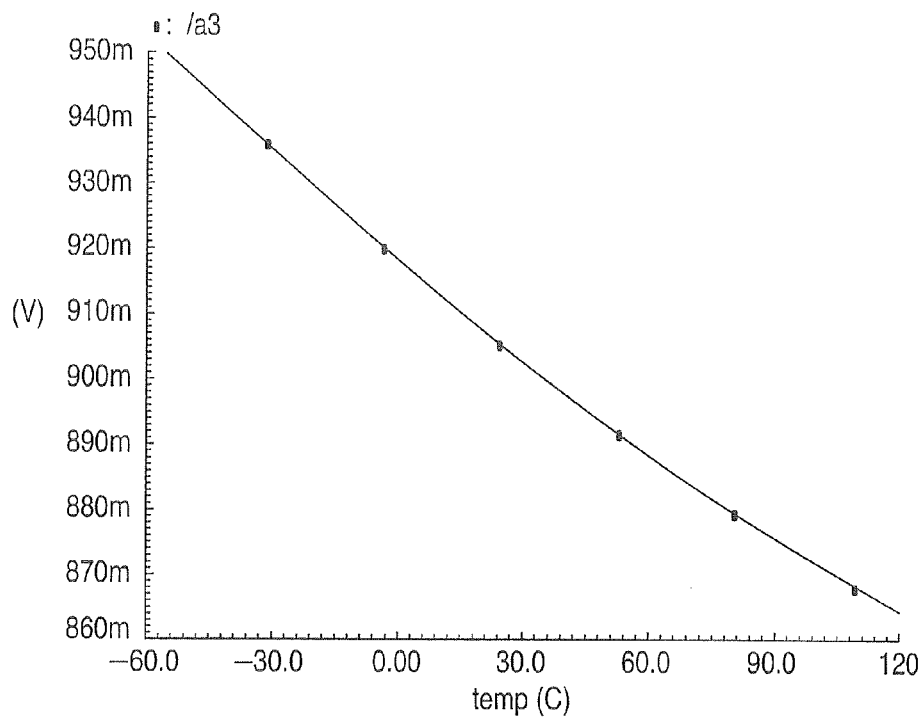
FIG. 3 illustrates a graph showing the temperature behavior of a trip point of the inverter circuit shown in FIG. 2.

The term "trip point" is defined as the voltage at the gates of PMOS transistor MP0 and NMOS transistor MN7 where the output of the inverter 200 is about to switch its state from "low state" to "high state" or from "high state" to "low state." FIG. 3 illustrates a graph showing the temperature behavior of the "trip point" of inverter 200 shown in FIG. 2. The vertical axis of the graph in FIG. 3 represents voltages in a range from eight hundred sixty millivolts (860 mV) to nine hundred fifty millivolts (950 mV). The horizontal axis of the graph in FIG. 3 represents temperatures in a range from minus sixty degrees Centigrade (−60.0° C.) to positive one hundred twenty degrees Centigrade (120.0° C.).

As shown in FIG. 3, the "trip point" of inverter 200 varies almost linearly with temperature with a slope that is approximately equal to minus one half millivolt per degree Centigrade (−0.5 mV/° C.). This specific value of slope is valid only for a specific set of device parameters. Other values of device parameters would generate a different value of slope.

The inverter circuit 200 standing alone is not able to function as an under-voltage-lockout (UVLO) circuit. This is because the value of the "trip point" voltage is dependent upon the temperature. The "trip point" voltage of the inverter circuit 200 must be temperature compensated by driving the input of the inverter with a voltage that has the same temperature coefficient as the "trip point" voltage.

In the under-voltage-lockout (UVLO) circuit 100 shown in FIG. 1, NMOS transistor MN0, resistor R0 and resistor R1 form a temperature compensation circuit for the inverter circuit that is made up of PMOS transistor MP0 and NMOS transistor MN7.

Figure 4:
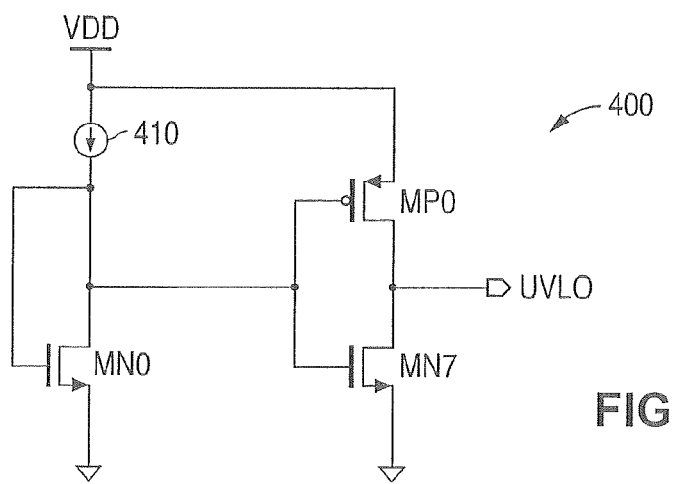
FIG. 4 illustrates a schematic diagram of a circuit that results from modifying the under-voltage-lockout (UVLO) circuit shown in FIG. 1.

To better understand the operation of UVLO circuit 100 consider the modified UVLO circuit 400 shown in FIG. 4. The resistor R0 of UVLO circuit 100 has been replaced with a constant current source 410 and the resistor R1 of UVLO circuit 100 has been shorted out. This causes the NMOS transistor MN0 to be diode connected. It is well known that there is a point where the temperature dependency of the mobility of a transistor and the threshold voltage of the transistor cancel out and thus yield a constant "diode" voltage. See, for example, a paper by I. M. Filanovsky and A. Allam entitled "Mutual Compensation of Mobility and Threshold Voltage Temperature Effects with Applications in CMOS Circuits", IEEE Trans. Circuits and Systems—I., Volume 48, No. 7, July 2001. See also a book by Y. Tsividis entitled "Operation and Modeling of the MOS Transistor", McGraw Hill, New York, 1987.

Electron mobility in an NMOS transistor has a negative temperature coefficient. On the other hand, the threshold voltage in an NMOS transistor has a negative temperature coefficient. At lower Vgs (gate to source voltage) drive, the effect of the threshold voltage dominates. This causes the drain current to increase with increases in temperature.

At higher Vgs (gate to source voltage) drive, however, the effect of mobility degradation dominates. This causes the drain current to decrease with increases in temperature. The rate at which the drain current varies with temperature can be controlled.

Now consider the original UVLO circuit 100 that is shown in FIG. 1. The goal is to drive the inverter circuit (made up of PMOS transistor MP0 and NMOS transistor MN7) so that it changes state at a relatively fixed value of VDD regardless of temperature variations. Bear in mind that the targeted UVLO threshold voltage value in this example is approximately two and two tenths volts (2.2 V).

NMOS transistor MN0, with its gate overdriven by approximately five hundred millivolts (500 mV), is operating at a point where the electron mobility is the dominating factor. At first glance, the gate voltage of NMOS transistor MN0 would drop at a rate of approximately one and one half millivolts per degree Centigrade (1.5 mV/° C.). But this effect is countered by the dominating mobility degradation effect which tends to decrease the drain current as the temperature increases. This effect may be seen in FIG. 5C. FIG. 5C illustrates a graph showing how the drain current of the NMOS transistor MN0 of UVLO circuit 100 decreases with increasing temperature. This effect consequently increases the gate voltage of NMOS transistor MN0 through resistor R1.

Figure 5A:
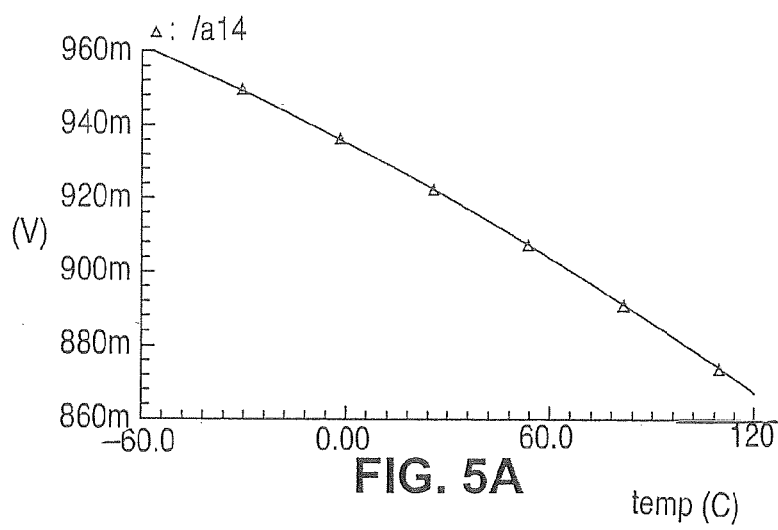
FIG. 5A illustrates a graph showing the temperature behavior of a drain voltage of third transistor (MN0) of the under-voltage-lockout (UVLO) circuit of the present invention.

If the resistance value of resistor R1 is properly chosen it is possible to arrive at a point where the drain voltage of NMOS transistor MN0 tracks the temperature behavior of the inverter "trip point." This effect may be seen in FIG. 5A. FIG. 5A illustrates a graph showing the temperature behavior of the drain voltage of NMOS transistor MN0 of the UVLO circuit 100. With increasing temperature the drain voltage of NMOS transistor MN0 decreases at a rate that is approximately one half millivolt per degree Centigrade (0.5 mV/° C.). The slope of the curve in FIG. 5A matches the slope of the curve in FIG. 3. At the critical point when the value of voltage of VDD crosses the UVLO threshold voltage, at any temperature, the inverter changes state and thereby signals the end of the UVLO period.

Figure 5B:
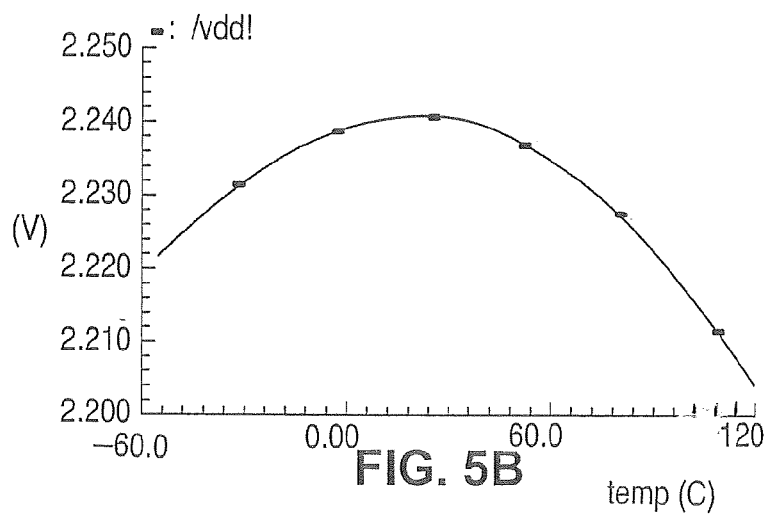
FIG. 5B illustrates a graph showing the temperature behavior of an under-voltage-lockout (UVLO) threshold voltage of the under-voltage-lockout (UVLO) circuit of the present invention.
Figure 5C:
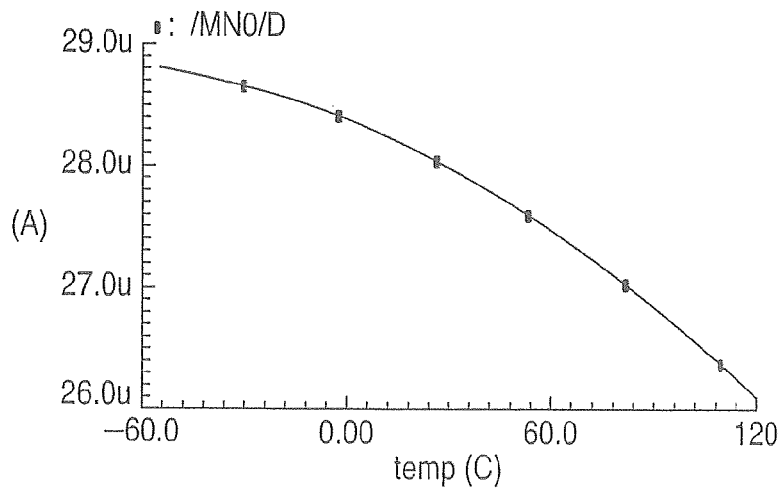
FIG. 5C illustrates a graph showing how the drain current of the third transistor (MN0) of the under-voltage-lockout (UVLO) circuit of the present invention decreases with increasing temperature.

FIG. 5B illustrates a graph showing the temperature behavior of the UVLO threshold voltage of the UVLO circuit 100. FIG. 5B illustrates the fact that the UVLO threshold voltage is insensitive to temperature variations. The value of the UVLO threshold voltage is approximately two and two tenths volts (2.2 V) for all relevant temperatures. Lastly, the value of resistance of resistor R0 is not a critical value as it only sets the approximate value of the UVLO threshold voltage.

Figure 6:
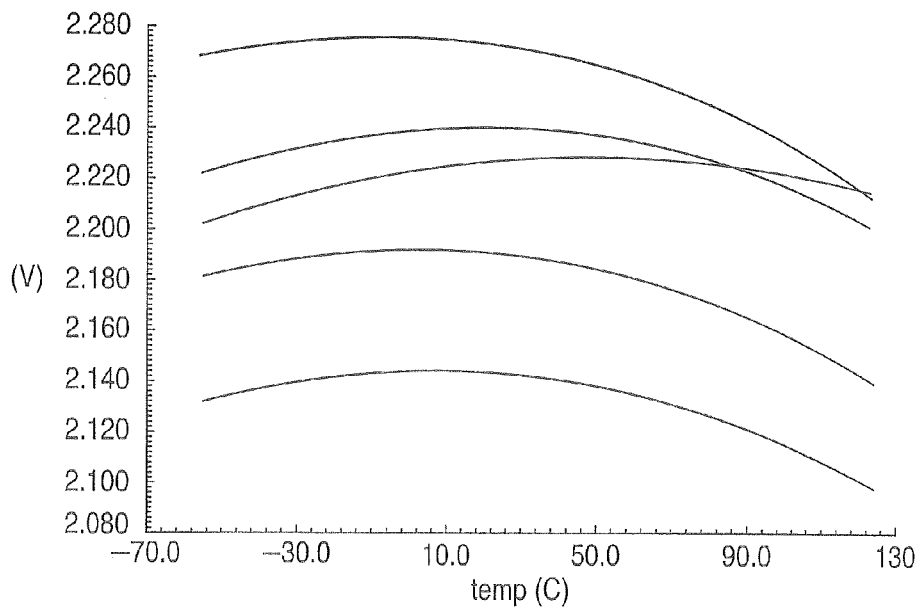
FIG. 6 illustrates a graph showing the temperature behavior of an under-voltage-lockout (UVLO) threshold voltage of the under-voltage-lockout (UVLO) circuit of the present invention over all process corners.

FIG. 6 illustrates a graph showing the temperature behavior of the UVLO threshold voltage of the UVLO circuit 100 over all process corners. The target UVLO threshold voltage is approximately two and two tenths volts (2.2 V).

Figure 7:
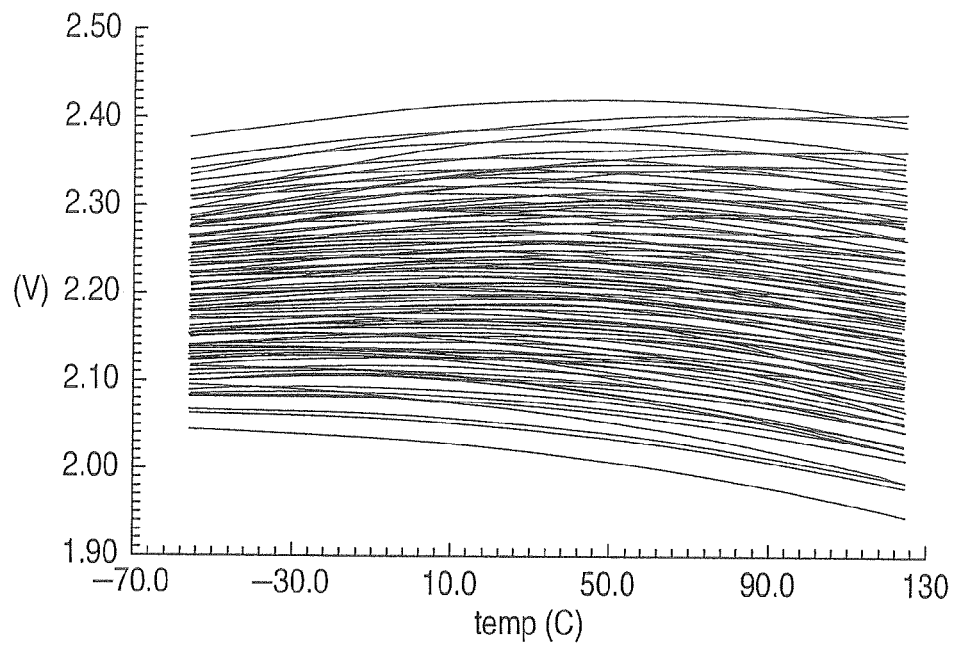
FIG. 7 illustrates a graph showing the temperature behavior of an under-voltage-lockout (UVLO) threshold voltage of the under-voltage-lockout (UVLO) circuit of the present invention over a combination of different process corners and device mismatches.

FIG. 7 illustrates a graph showing the temperature behavior of the UVLO threshold voltage of the UVLO circuit 100 over a combination of different process corners and device mismatches. There is a variation of plus or minus ten percent (+/−10%) in the value of the resistors. There is also a variation of plus or minus five microns (5 μm) in the NMOS dimensions. The simulation shown in FIG. 7 was performed to demonstrate the degree of sensitivity to the UVLO circuit 100 to process variations.

Figure 8:
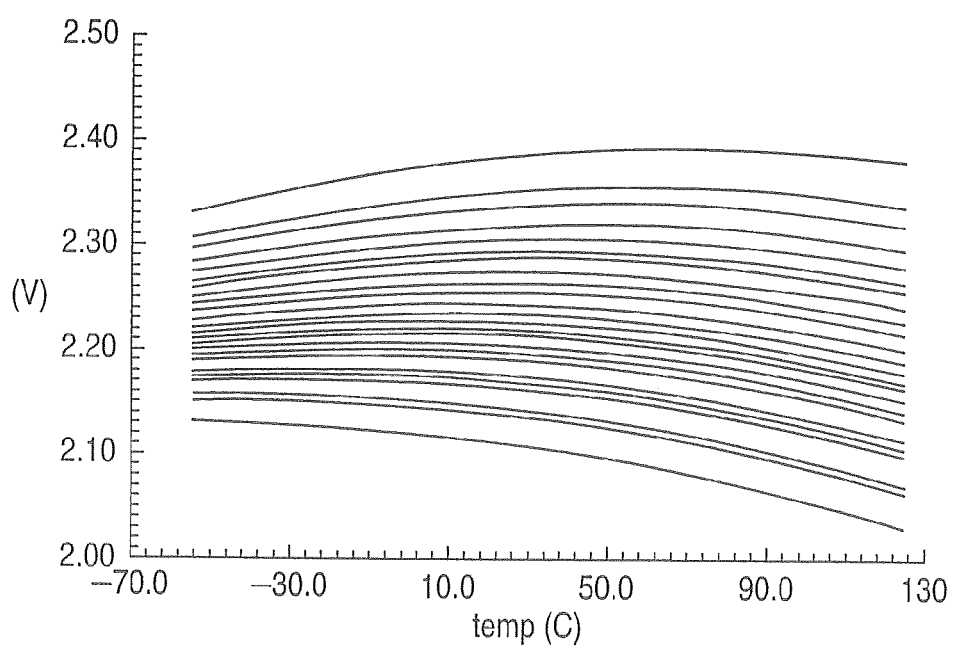
FIG. 8 illustrates a graph showing the temperature behavior of an under-voltage-lockout (UVLO) threshold voltage of the under-voltage-lockout (UVLO) circuit of the present invention over a typical process corner but with all device mismatches.

FIG. 8 illustrates a graph showing the temperature behavior of the UVLO threshold voltage of the UVLO circuit 100 over a typical process corner but with all device mismatches. The simulation shown in FIG. 8 also has a variation of plus or minus ten percent (+/−10%) in the value of the resistors and a variation of plus or minus five microns (5 μm) in the NMOS dimensions.

Figure 9:
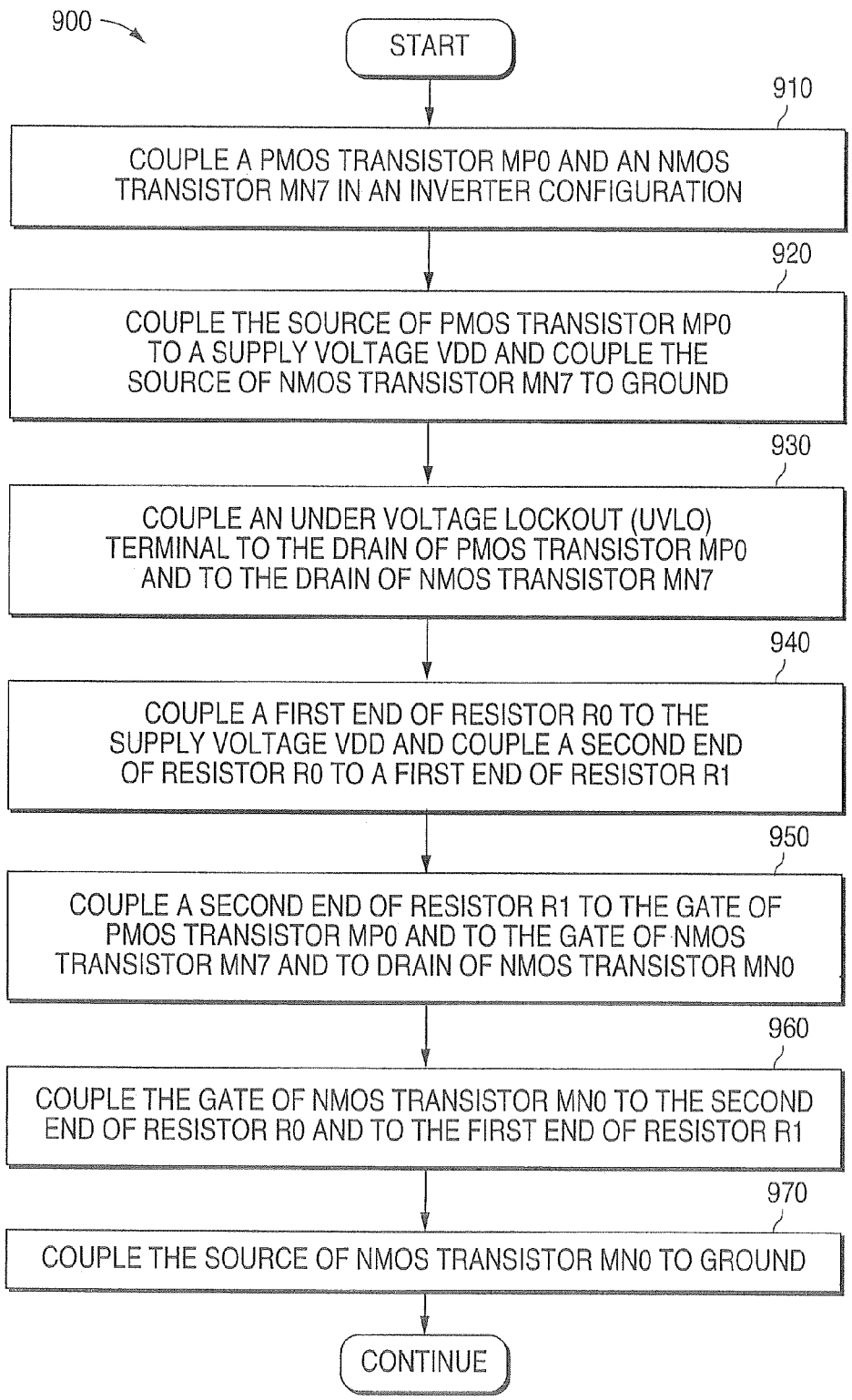
FIG. 9 illustrates a flow chart showing the steps of an advantageous embodiment of the method for constructing an under-voltage-lockout (UVLO) circuit of the present invention.

FIG. 9 illustrates a flow chart showing the steps of an advantageous embodiment of a method for constructing an under-voltage-lockout (UVLO) circuit of the present invention. First couple a PMOS transistor MP0 and an NMOS transistor MN7 in an inverter configuration (step 910). Then couple the source of PMOS transistor MP0 to a supply voltage VDD and couple the source of NMOS transistor MN7 to ground (step 920). Then couple an under-voltage-lockout (UVLO) terminal to the drain of PMOS transistor MP0 and to the drain of NMOS transistor MN7 (step 930).

Then couple a first end of resistor R0 to the supply voltage VDD and couple a second end of resistor R0 to a first end of resistor R1 (step 940). Then couple a second end of resistor R1 to the gate of PMOS transistor MP0 and to the gate of NMOS transistor MN7 and to the drain of NMOS transistor MN0 (step 950). Then couple the gate of NMOS transistor MN0 to the second end of resistor R0 and to the first end of resistor R1 (step 960). Then couple the source of NMOS transistor MN0 to ground (step 970).

Although the present invention has been described with an exemplary embodiment, various changes and modifications may be suggested to one skilled in the art. It is intended that the present invention encompass such changes and modifications as fall within the scope of the appended claims.

The invention claimed is:

1. A temperature compensated under-voltage-lockout circuit having a trip point voltage that is not dependent upon temperature, wherein said temperature compensated under-voltage-lockout circuit comprises at most three transistors, wherein said temperature compensation circuit comprises a first NMOS transistor, a first resistor, and a second resistor connected in series, the first and second resistors each having a first end and a second end, wherein a gate of said first NMOS transistor is coupled to a common terminal at said second end of said first resistor and said first end of said second resistor.

2. The temperature compensated under-voltage-lockout circuit as set forth in claim 1 comprising:
   a supply voltage;
   an inverter circuit coupled to said supply voltage; and
   a temperature compensation circuit coupled to said supply voltage and to said inverter circuit, wherein said temperature compensation circuit compensates for a temperature of said trip point voltage of said inverter circuit.

3. The temperature compensated under-voltage-lockout circuit as set forth in claim 2 wherein said temperature compensation circuit temperature compensates a trip point voltage of said inverter circuit by driving an input of said inverter circuit with a voltage that has a same temperature coefficient as said trip point voltage of said inverter circuit.

4. The temperature compensated under-voltage-lockout circuit as set forth in claim 2 wherein said inverter circuit detects a value of supply voltage and outputs an enable signal to a separate circuit in response to detecting said value of supply voltage.

5. The temperature compensated under-voltage-lockout circuit as set forth in claim 2 wherein said inverter circuit detects a value of supply voltage and outputs a disable signal to a separate circuit in response to detecting said value of supply voltage.

6. The temperature compensated under-voltage-lockout circuit as set forth in claim 2 wherein said inverter circuit comprises a PMOS transistor and a second NMOS transistor, wherein a source of said PMOS transistor is coupled to said supply voltage;
- wherein a drain of said PMOS transistor is coupled to a drain of said second NMOS transistor;
- wherein a gate of said PMOS transistor is coupled to a gate of said second NMOS transistor; and
- an under-voltage-lockout terminal is coupled to said drain of said PMOS transistor and to said drain of said second NMOS transistor.

7. The temperature compensated under-voltage-lockout circuit as set forth in claim 6 wherein
- said first end of said first resistor is coupled to said supply voltage and to said source of said PMOS transistor; and
- said second end of said second resistor is coupled to a drain of said first NMOS transistor and coupled to said gate of said PMOS transistor and coupled to said gate of said second NMOS transistor.

8. The temperature compensated under-voltage-lockout circuit as set forth in claim 7 wherein a source of said first NMOS transistor is coupled to ground and a source of said second NMOS transistor is coupled to ground.

9. The temperature compensated under-voltage-lockout circuit as set forth in claim 7 wherein said second resistor has a value of resistance that causes a drain voltage of said first NMOS transistor to track a temperature behavior of said trip point voltage of said inverter.

10. The temperature compensated under-voltage-lockout circuit as set forth in claim 9 wherein a drain current of said first NMOS transistor decreases with increasing temperature.

11. The temperature compensated under-voltage-lockout circuit as set forth in claim 10 wherein said decrease of drain current of said first NMOS transistor increases a gate voltage of said first NMOS transistor through said second resistor.

12. The temperature compensated under-voltage-lockout circuit as set forth in claim 11 wherein an under-voltage-lockout (UVLO) threshold voltage is insensitive to temperature variations.

13. A temperature compensated under-voltage-lockout circuit having a trip point voltage that is not sensitive to temperature variation, said temperature compensated under-voltage-lockout circuit comprising at most three transistors and comprising:
- a supply voltage;
- an inverter circuit coupled to said supply voltage; and
- a temperature compensation circuit coupled to said supply voltage and coupled to said inverter circuit for compensating a temperature coefficient of a trip point voltage of said inverter circuit, wherein said temperature compensation circuit comprises a first NMOS transistor, a first resistor, and a second resistor connected in series.

14. The under-voltage-lockout circuit as set forth in claim 13 wherein said temperature compensation circuit temperature compensates said trip point voltage of said inverter circuit by driving an input of said inverter circuit with a voltage that has a same temperature coefficient as said trip point voltage.

15. The temperature compensated under-voltage-lockout circuit as set forth in claim 14 wherein said inverter circuit detects a value of supply voltage and in response to detecting said value of supply voltage outputs to a separate circuit one of an enable signal and a disable signal.

16. The temperature compensated under-voltage-lockout circuit as set forth in claim 14 wherein said inverter circuit comprises a PMOS transistor and a second NMOS transistor, wherein a source of said PMOS transistor is coupled to said supply voltage;
- wherein a drain of said PMOS transistor is coupled to a drain of said second NMOS transistor;
- wherein a gate of said PMOS transistor is coupled to a gate of said second NMOS transistor; and
- an under-voltage-lockout terminal is coupled to said drain of said PMOS transistor and to said drain of said second NMOS transistor.

17. The temperature compensated under-voltage-lockout circuit as set forth in claim 16
- said first resistor has a first end coupled to said supply voltage and to said source of said PMOS transistor;
- said second resistor has a first end coupled to a second end of said first resistor and coupled to a drain of said first NMOS transistor and coupled to said gate of said PMOS transistor and coupled to said gate of said second NMOS transistor;
- wherein a gate of said first NMOS transistor is coupled to said second end of said first resistor and to said first end of said second resistor; and
- wherein a source of said first NMOS transistor is coupled to ground and a source of said second NMOS transistor is coupled to ground.

18. A method for providing a temperature compensated under-voltage-lockout circuit that is not sensitive to temperature variation, said method comprising the steps of:
- providing a supply voltage;
- coupling an inverter circuit that comprises at most two transistors to said supply voltage;
- coupling a temperature compensation circuit that comprises a first NMOS transistor, a first resistor, and a second resistor, connected in series, to said supply voltage and to said inverter circuit; and
- compensating with a combination of said inverter circuit and said temperature compensation circuit a temperature coefficient of a trip point voltage of said inverter circuit.

19. The method as set forth in claim 18 wherein said step of compensating with a combination of said inverter circuit and said temperature compensation circuit a temperature coefficient of a trip point voltage of said inverter circuit comprises the step of:
- driving an input of said inverter circuit with a voltage that has a same temperature coefficient as said trip point voltage of said inverter circuit.

20. The method as set forth in claim 19 further comprising the steps of:
- detecting in said inverter circuit a value of supply voltage; and
in response to detecting said value of supply voltage outputting to a separate circuit one of an enable signal and a disable signal.

* * * * *